3,073,882
THERMOELECTRIC MATERIAL

Samuel W. Kurnick and Lee D. La Grange, San Diego, Robert L. Fitzpatrick, La Mesa, and Marshal F. Merriam, San Diego, Calif., assignors to General Dynamics Corporation, New York, N.Y., a corporation of Delaware No Drawing. Filed June 19, 1961, Ser. No. 117,772
15 Claims. (Cl. 136—5)

The present invention generally relates to thermoelectric material and more particularly relates to semiconductor elements having improved thermoelectric efficiency and to methods of making the same.

In order to obtain a high conversion efficiency in a thermoelectric device, both the figure of merit of each dissimilar semiconductor and the difference in temperature between the hot and cold junction should be high as possible. The figure of merit is equal to the square of the Seebeck coefficient times the specific electrical conductivity of the semiconductor divided by the thermal conductivity of the semiconductor.

Recently, increased attention has been directed towards the development of semiconductors having a high figure of merit at relatively high temperatures, for example, 800° K. to 1600° K. Difficulties have been encountered inasmuch as the figure of merit of most semiconductors seriously depreciates as temperatures increase beyond moderate limits. However, it has been found that certain semiconductors are more or less suitable for use at the indicated high temperatures, although they have a relatively low figure of merit. Cerium sulfide is a primary example of such semiconductors, particularly of the n-type.

Such a high temperature semiconductor has the desirable high temperature properties, including low crystal lattice thermal conductivity and high chemical stability at elevated temperatures of the order of 800° K. or more. It is believed that the conduction mechanism in the indicated high temperature semiconductor is similar to that of the polaron model wherein the electrons proceed simultaneously with the polarization of the surrounding medium. In cerium sulfide this type of conduction mechanism is characterized by a rise in Seebeck potential with increasing temperature, a slowly decreasing electrical conductivity with increasing temperatures and an extremely small Hall coefficient. This semiconductor is, therefore, attractive for high temperature use.

It would be desirable to substantially enhance the figure of merit of such a high temperature semiconductor at the maximum temperature of the heat source so as to improve its utility in thermoelectric generators and the like. In other words, the product $zT$, where $z$ is the figure of merit and T is equal to the temperature of the hot junction plus the temperature of the cold junction divided by 2, should be as high as possible.

It has now been discovered that the figure of merit of high temperature semiconductors can be sufficiently optimized to provide $zT$ values substantially above 0.1 and in many instances of the order of about 1.0. Such optimization of $zT$ values can be provided with a minimum of difficulty in accordance with the method of the present invention.

Accordingly, it is the principal object of the present invention to provide improved semiconductors for thermoelectric conversion. It is also an object of the present invention to provide a method of making improved semiconductor elements operable at high temperatures in excess of 800° K. with improved thermoelectric efficiency. It is a further object of the present invention to provide improved high temperature semiconductor elements by a simple method which increases the figure of merit of such semiconductor elements to a substantial extent.

Further objects and advantages of the present invention will be apparent from a study of the following detailed description.

The method of the present invention generally comprises adding to a high temperature semiconductor material such as cerium sulfide, a figure of merit-improving concentration of a substance which dissolves in the semiconductor and which stretches the crystal lattice, i.e., the lattice spacing of the crystal structure, e.g., with consequent improvements in the thermoelectric properties of the semiconductor.

The thermoelectric efficiency of a high temperature semiconductor such as cerium sulfide can be substantially increased without changing the basic $Th_3P_4$ type crystal structure of the cerium sulfide. This involves the addition, in solid solution, of a crystal lattice-stretching amount of a barium compound such as barium sulfide.

Now referring more particularly to the steps of the method of the present invention, a major proportion of the above-mentioned high temperature semiconductor element, cerium sulfide, is combined with a minor proportion of barium sulfide. The semiconductor material is relatively stable at high temperatures of about 800° K. and above. Cerium sulfide having a formula of $Ce_2S_3$ can be prepared by reacting approximately stoichiometric amounts of $CeO_2$ and $H_2S$ together in the presence of carbon. The $Ce_2S_3$ can then be melted down to provide an optimal lattice arrangement, the sulfur concentration therein being adjusted during the melting operation. That is, a desired amount of sulfur can be removed by boiling off from the molten cerium sulfide so as to provide the desired conductivity of the semiconductor. Thus, the sulfur concentration can be adjusted to provide cerium sulfide having the formula $CeS_{1.33-1.50}$, i.e., between $Ce_2S_3$ and $Ce_3S_4$. The product can then be allowed to cool and solidify.

Barium sulfide is added to the cerium sulfide, in accordance with the present invention. The addition of barium sulfide is controlled to provide the desired results. Thus, a sufficient amount of barium sulfide is mixed with cerium sulfide to provide a concentration of barium in the crystal lattice of cerium sulfide of from about 4 to about 14 atom percent. Thus, at least about 4 atom percent of barium is usually necessary to provide any appreciable increase in the parameter of the semiconductor crystal lattice. Furthermore, the limit of solubility of the barium in the cerium sulfide is approximately 14 percent. It has further been found that for desired overall results, a concentration of barium of about 7 atom percent is preferred.

Addition of the barium in a concentration within the indicated range of from about 4 to about 14 atom percent stretches the cerium sulfide crystal lattice to a substantial extent and improves the figure of merit for the semiconductor material. However, no changes occur in the basic type of lattice. The cerium sulfide crystal lattice, after as well as before introduction of barium sulfide, is a thorium phosphide ($Th_3P_4$) type crystal lattice. The initial cerium sulfide crystal lattice parameter without barium addition is about 8.6 angstroms. It can be stretched to about 8.82 angstroms by the addition of the barium, the extent of increase depending upon the concentration of barium added to the cerium sulfide crystal lattice.

In order to be effective in stretching the cerium sulfide crystal lattice, the barium must be dissolved in the cerium sulfide and present in the crystal lattice thereof. Any undissolved barium which may be present is without effect in stretching the cerium sulfide crystal lattice and, more-over, may have undesirable effects on other properties of the semiconductor. Accordingly, all barium present should be in solution in the cerium sulfide.

Another important factor regarding the addition of barium sulfide to cerium sulfide is the adjustment necessary with respect to the sulfur ratio to the total metal, i.e., cerium plus barium. Thus, the total sulfur, represented by the sulfur of the barium sulfide plus the sulfur of the cerium sulfide should be controlled to provide a desired conductivity for the semiconductor material. In this regard, the total sulfur ratio to the total metal should be between about 1.3:1 and about 1.5:1, preferably approximately 1.4:1. It is desirable to provide the semiconductor with a conductivity somewhere between the two extremes of an insulator and a metal. The conductivity of the cerium sulfide-barium sulfide mixture can be readily adjusted, as desired, as by boiling off excess sulfur from the molten mixture, etc.

In carrying out the method of the present invention, after the barium sulfide and semiconductor are mixed together, the barium sulfide is alloyed with the cerium sulfide. This can readily be accomplished by heat treating the mixture at any suitable temperature, pressure, etc., depending on the particular alloy required. Thus, for example, fine grained $Ce_2S_3$ and BaS (prepared from $BaCO_3$ by treatment at elevated temperatures with $H_2S$) may be compressed in dies and annealed at about 1500° C. for about an hour, so as to minimize loss of BaS at the melting point of the alloy. The sintered mixture in each case may then be melted down and zone leveled.

The mixture of barium sulfide and cerium sulfide can also be formed by treating a mixture of $BaCO_3$ and $CeO_2$ with $H_2S$ in the presence of carbon at gradually increasing temperatures so that both carbon and oxygen are eliminated and an alloy having the overall composition of $Ce_2BaS_4$ is formed.

Following solidification of the mixture, the formed n-type semiconductor element is ready for incorporation in a thermoeelctric generator or the like in combination with a p-type semiconductor element. A conventional type method of joining the n-type and p-type semiconductor elements in the electrical apparatus may be used and, accordingly, is not described hereinafter.

A number of tests have been performed on cerium sulfide n-type semiconductor elements containing barium sulfide in solid solution therein to determine thermoelectric properties thereof. In one test, two semiconductor elements were tested to determine their expansion coefficients, over a range of temperatures between room temperature (22° C.) and 1000° C. The two semiconductor elements were substantially identical in that each comprised cerium sulfide, except that one element (A) was prepared in accordance with the method of the present invention and contained approximately 7 atom percent of barium. The other element (B) contained no addends (barium sulfide, etc.).

Element A was prepared by grinding together cerium sulfide with barium sulfide, melting the mixture to place the barium in solution in the cerium sulfide lattice, and adjusting the sulfur to total metal ratio (Ce+Ba) to about 1.4:1 by boiling off excess sulfur. The mixture was then slowly cooled and solidified to a finished product.

Element A was found to exhibit a higher thermal expansion coefficient, approximately 4 percent higher than the element B (which was free of barium sulfide). This result indicated higher anharmonicities with respect to lattice vibrations, and lower thermal conductivity. It was found that the crystal lattice parameter of cerium sulfide had increased from about 8.6 A. (with no barium sulfide present) to about 8.8 A. (with the barium sulfide present as indicated).

By assuming the thermal conductivity of elements A and B to be approximately 0.010 watt per cm.-degree, the $zT$ at hot junction temperature of 1300° K. was calculated to be approximately 1.0 for element A in contrast to a maximum $zT$ of under 0.5 for the untreated cerium sulfide (element B). Throughout a temperature range between about 800° K. and 1300° K. element A containing the barium sulfide had a $zT$ between about 2 times and about 4 times that of element B not containing the barium sulfide. This remarkable increase in $zT$ was wholly unexpected.

The improved semiconductor elements are particularly important for high temperature use in thermoelectric generators and the like, for example, generators for use in nuclear reactors, solar generators, etc. Heretofore, even minor improvements in thermoelectric efficiency have been obtained with difficulty. Now, in accordance with the present invention, the thermoelectric efficiency of high temperature semiconductor elements can be improved to a substantial extent with a minimum of difficulty. Other advantages of the present invention are set forth in the foregoing.

Various of the features of the present invention are as set forth in the appended claims.

What is claimed is:

1. A method of making an improved semiconductor element, which method comprises the step of alloying a major proportion of cerium sulfide semiconductor material, chemically stable at temperatures in excess of 800° K., with a minor proportion of a barium compound which enters into solution in the cerium sulfide and stretches the crystal lattice thereof, said proportion of said compound being sufficient to substantially stretch the crystal lattice of said cerium sulfide, all of said compound dissolving in said cerium sulfide, said compound improving the figure of merit of said semiconductor material.

2. A method of making an improved semiconductor element which method comprises the steps of mixing together a major proportion of cerium sulfide semiconductor material, chemically stable at temperatures in excess of 800° K. and a minor proportion of barium sulfide, sufficient to stretch the crystal lattice of said cerium sulfide, and improve the figure of merit of the cerium sulfide, dissolving substantially all of said barium sulfide in said cerium sulfide, and forming an improved solid semiconductor element therefrom.

3. A method of making an improved semiconductor element which method comprises the steps of mixing together cerium sulfide semiconductor material and a minor proportion of barium sulfide to provide a concentration of from about 4 to about 14 atom percent of barium, based on the cerium, dissolving said barium sulfide in said cerium sulfide and adjusting the atom ratio of the total sulfur in the resulting solution to the total metal, that is, cerium plus barium, present to a value between about 1.33:1 and about 1.50:1, thereafter cooling said solution to form a solid semiconductor element therefrom, said barium in the crystal lattice of said cerium sulfide causing stretching of said lattice and improvement of the figure of merit of the semiconductor element.

4. A method of making an improved semiconductor element which method comprises the steps of mixing together cerium sulfide semiconductor material and a sufficient amount of barium sulfide to provide a concentration of barium of about 7 atom percent, said amount being sufficient to stretch the crystal lattice of said cerium sulfide and improve the figure of merit of said semiconductor material, melting the mixture to alloy the barium sulfide and cerium sulfide, and controlling the temperature of the melted mixture to remove any excess sulfur and adjust the atom ratio of total sulfur in the melt to total metal, that is, cerium plus barium, in the melt to about 1.4:1, thereafter cooling said melt sufficiently slowly to solidify said semiconductor element without substantial cracking thereof, whereby an improved semiconductor element is provided.

5. An improved semiconductor element, stable at temperatures in excess of 800° K. and having an improved figure of merit, said element comprising a major proportion of cerium sulfide and a minor proportion of a barium compound in solid solution in said cerium sulfide, the metal of said compound being in sufficient concentration in the crystal lattice of said cerium sulfide, so that the lattice parameter is increased, said element having an improved figure of merit.

6. An improved semiconductor element chemically stable at temperatures in excess of 800° K., said element comprising a major proportion of cerium sulfide semiconductor and a minor proportion of barium sulfide in solid solution in said cerium sulfide, the concentration of barium present in the crystal lattice of said cerium sulfide being sufficiently large so that the lattice parameter is increased, and the figure of merit of said element is improved.

7. A method of making an improved semiconductor element which method comprises the steps of mixing together a major proportion of a cerium-containing compound and a minor proportion of a barium-containing compound and treating the resulting mixture with a sulfur-containing compound so as to form in situ an alloy of cerium sulfide and barium sulfide, the barium sulfide being present in an amount sufficient to stretch the crystal lattice of the cerium sulfide, and improve the figure of merit of the cerium sulfide, substantially all of said barium sulfide dissolving in said cerium sulfide.

8. A method of making an improved semiconductor element which method comprises the steps of mixing together a major proportion of cerium oxide and a minor proportion of barium carbonate and reacting the resulting mixture at elevated temperatures with hydrogen sulfide in the presence of carbon, whereby an alloy of cerium sulfide and barium sulfide is formed and carbon and oxygen are eliminated from the mixture, said barium of said barium sulfide being present in an amount sufficient to stretch the crystal lattice of said cerium sulfide, and improve the figure of merit of said cerium sulfide, substantially all of said barium sulfide dissolving in said cerium sulfide, and forming an improved solid semiconductor element therefrom.

9. A method of making an improved semiconductor element which method comprises the steps of mixing together a major proportion of cerium oxide and a minor proportion of barium carbonate, said barium carbonate being in an amount sufficient to provide a concentration of barium in the crystal lattice of cerium sulfide which stretches said lattice, reacting the mixture at elevated temperatures with hydrogen sulfide in the presence of carbon to form an alloy of cerium sulfide and barium sulfide, substantially all of the barium sulfide dissolving in the cerium sulfide, with the barium disposed in the crystal lattice of the cerium sulfide and with total sulfur in an atom ratio to total metal of about 1.33:1, thereafter melting and cooling said sulfide to form a solid semiconductor element having an improved figure of merit.

10. A method of making an improved semiconductor element which method comprises the steps of mixing together a major proportion of cerium sulfide semiconductor material and a minor proportion of barium sulfide sufficient to stretch the crystal lattice of said cerium sulfide, all of said barium sulfide being dissolvable in said cerium sulfide, compressing the mixture in a die and annealing the same to a sintered mass, whereby loss of barium sulfide during subsequent melting is minimized, thereupon melting the sintered mass and zone leveling the same to dissolve the barium sulfide in the cerium sulfide, and forming therefrom a solid semiconductor element having an improved figure of merit.

11. A method of making an improved semiconductor element which method comprises the steps of mixing together a major proportion of cerium sulfide semiconductor material and a minor proportion of barium sulfide to provide a concentration of from about 4 to about 14 atom percent of barium, compressing said mixture in a die and annealing the mixture at about 1500° C. for a time sufficient to provide a sintered mixture, whereby loss of barium sulfide during subsequent melting is minimized, thereafter melting the sintered mixture and zone leveling the same, thereby dissolving the barium sulfide in the cerium sulfide, the atom ratio of the total sulfur in the resulting solution to the total metal being adjusted to a value between about 1.33:1 and about 1.50:1, thereafter cooling said solution to form therefrom a solid semiconductor element having an improved figure of merit.

12. A method of making an improved semiconductor element which method comprises the steps of mixing together a major proportion of cerium sulfide semiconductor material and a minor proportion of barium sulfide to provide a concentration of about 7 atom percent of barium, compressing the mixture in a die and annealing it at about 1500° C. for a time sufficient to provide a sintered mixture, whereby loss of barium sulfide during subsequent melting is minimized, thereafter melting the sintered mixture and zone leveling the same, whereby the barium sulfide is dissolved in the cerium sulfide, the atom ratio of total sulfur in the resulting solution to total metal being about 1.4:1, thereafter cooling said solution to form therefrom a solid semiconductor element having an improved figure of merit.

13. An improved semiconductor element chemically stable at temperatures in excess of 800° K., said element comprising cerium sulfide containing in solid solution an amount of barium solfide sufficient to provide in the crystal lattice of said cerium sulfide a concentration of barium of between about 4 and about 14 atom percent, whereby the crystal lattice of said cerium sulfide is stretched, said element having an improved figure of merit.

14. An improved semiconductor element, chemically stable at temperature in excess of 800° K., said element comprising cerium sulfide containing in solid solution a sufficient amount of barium sulfide to provide in the crystal lattice of said cerium sulfide a concentration of barium of between about 4 and about 14 atom percent, the total sulfur present in said semiconductor element being in a ratio to the total metal, that is, cerium plus barium, present of between about 1.33:1 and about 1.50:1, said cerium sulfide crystal of said semiconductor element having an increased lattice parameter and said semiconductor element having an improved figure of merit.

15. An improved semiconductor element, chemically stable at temperatures in excess of 800° K., said element comprising cerium sulfide containing in solid solution a sufficient amount of barium sulfide to provide in the crystal lattice of said cerium sulfide a concentration of about 7 atom percent of barium, said crystal lattice thereby having an increased parameter, said element having an improved thermoelectric efficiency, the total amount of sulfur present in said semiconductor element being in a ratio to the total amount of metal, that is, the cerium plus barium in said semiconductor of about 1.4:1.

No references cited.